(12) United States Patent
Stevenson

(10) Patent No.: US 9,698,800 B2
(45) Date of Patent: Jul. 4, 2017

(54) SYSTEM AND METHOD FOR CLOCK GENERATION WITH AN OUTPUT FRACTIONAL FREQUENCY DIVIDER

(71) Applicant: Linear Technology Corporation, Milpitas, CA (US)

(72) Inventor: Jan-Michael Stevenson, Lucas, TX (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 14/660,711

(22) Filed: Mar. 17, 2015

(65) Prior Publication Data

US 2016/0036455 A1    Feb. 4, 2016

Related U.S. Application Data

(60) Provisional application No. 62/030,486, filed on Jul. 29, 2014.

(51) Int. Cl.
*H03L 7/16* (2006.01)
*H03K 21/10* (2006.01)
*H03K 23/48* (2006.01)

(52) U.S. Cl.
CPC ............... *H03L 7/16* (2013.01); *H03K 21/10* (2013.01); *H03K 23/486* (2013.01)

(58) Field of Classification Search
CPC ..... H03L 7/02; H03L 7/06; H03L 7/08; H03L 7/16; H03L 7/183; H03K 3/012; H03K 3/017; H03K 21/10; H03K 23/00; H03K 23/50
USPC ................................. 327/115, 156, 158, 161
See application file for complete search history.

(56) References Cited

U.S. PATENT DOCUMENTS

| | | | | |
|---|---|---|---|---|
| 6,466,073 B1 * | 10/2002 | Yukinari | ................... | G06F 1/08 327/115 |
| 8,368,436 B1 * | 2/2013 | Chu | ........................ | H04L 27/01 327/147 |
| 2007/0041486 A1 * | 2/2007 | Shin | ........................ | H03L 7/081 375/376 |
| 2008/0290954 A1 * | 11/2008 | Chambers | ............ | H03K 23/486 331/18 |

* cited by examiner

*Primary Examiner* — John Poos
(74) *Attorney, Agent, or Firm* — VLP Law Group LLP; Edward Kwok

(57) ABSTRACT

A system and a method generate clock signals using an output divider with modulus steps of half-integers (i.e., the output circuit includes a divider which divides by one or more of 2, 2.5, 3, 3.5, 4 . . . ).

6 Claims, 8 Drawing Sheets

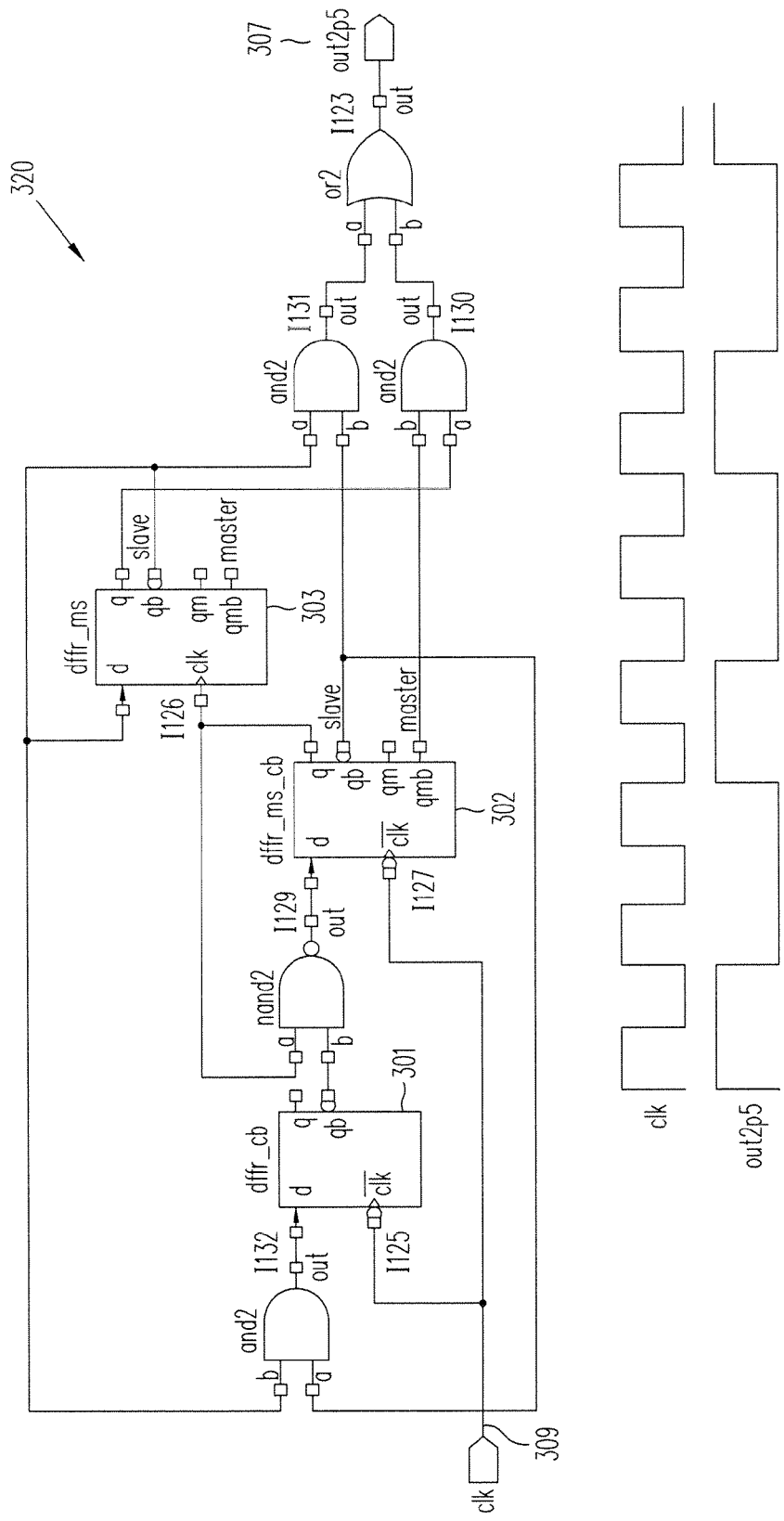

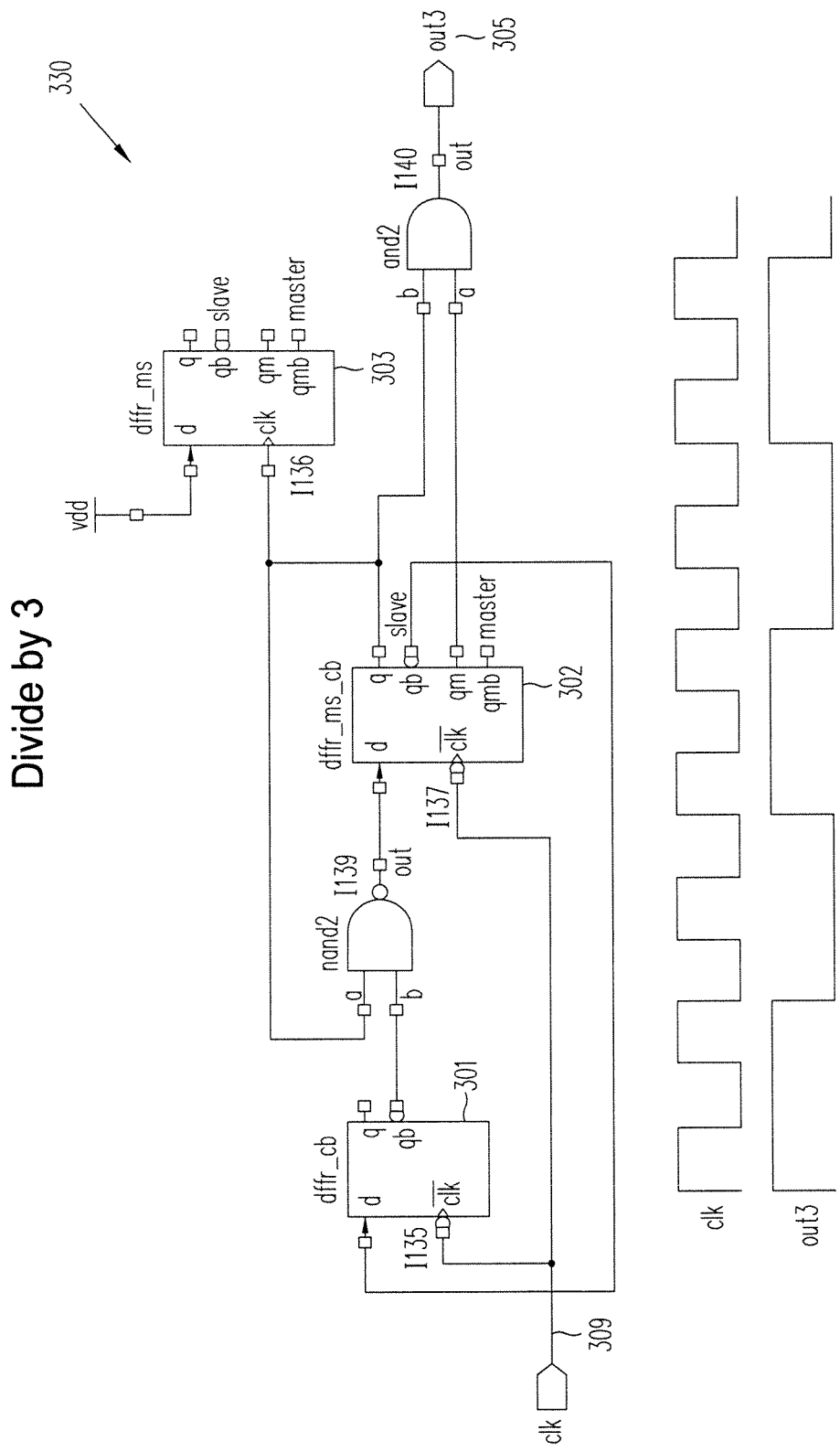

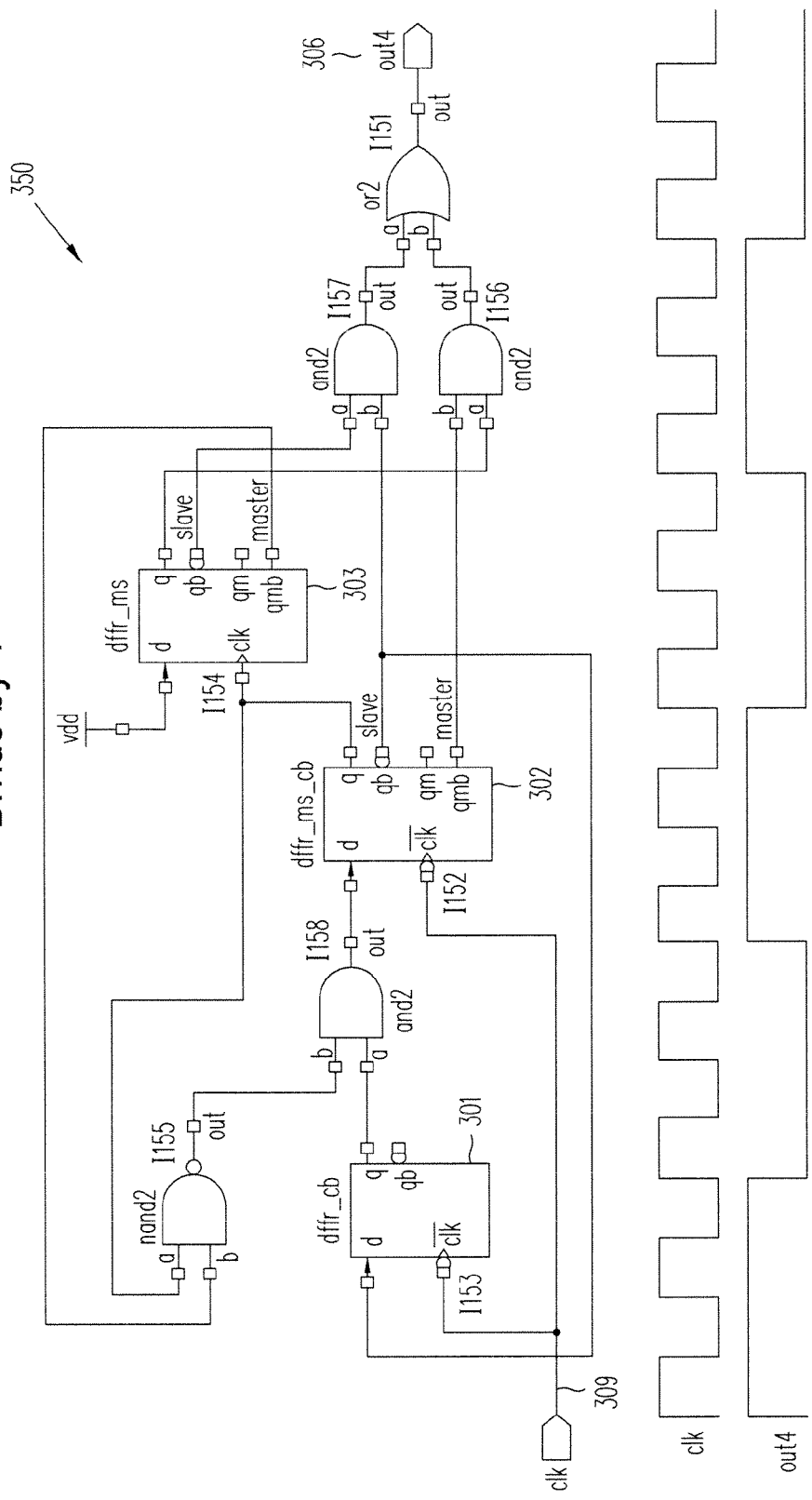

Divide by 2:

| CLK | S0 | S1m | S1s | S2m | S2s | Out |
|---|---|---|---|---|---|---|
| 0 | 0 | 0 | 0 | 1 | 0 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 1 | 0 | 1 | 1 | 0 |
| 0 | 0 | 1 | 1 | 1 | 1 | 0 |
| 1 | 0 | 0 | 1 | 1 | 1 | 1 |

$$Out_2 = \overline{S1m}$$

FIG. 4a

Divide by 2.5:

| CLK | S0 | S1m | S1s | S2m | S2s | Out |
|---|---|---|---|---|---|---|
| 0 | 0 | 0 | 0 | 1 | 0 | 1 |
| 1 | 0 | 1 | 0 | 1 | 0 | 1 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 0 | 1 | 1 |
| 1 | 0 | 1 | 0 | 0 | 1 | 0 |
| 0 | 0 | 1 | 1 | 0 | 0 | 0 |
| 1 | 0 | 0 | 1 | 0 | 0 | 0 |
| 0 | 0 | 0 | 0 | 1 | 0 | 1 |
| 1 | 0 | 1 | 0 | 1 | 0 | 1 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 0 | 1 | 1 |
| 1 | 0 | 1 | 0 | 0 | 1 | 0 |
| 0 | 0 | 1 | 1 | 0 | 0 | 0 |
| 1 | 0 | 0 | 1 | 0 | 0 | 0 |
| 0 | 0 | 0 | 0 | 1 | 0 | 1 |
| 1 | 0 | 1 | 0 | 1 | 0 | 1 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 0 | 1 | 1 |
| 1 | 0 | 1 | 0 | 0 | 1 | 0 |
| 0 | 0 | 1 | 1 | 0 | 0 | 0 |
| 1 | 0 | 0 | 1 | 0 | 0 | 0 |
| 0 | 0 | 0 | 0 | 1 | 0 | 1 |
| 1 | 0 | 1 | 0 | 1 | 0 | 1 |

$$Out_{2.5} = S2s \cdot \overline{S1m} + \overline{S2s} \cdot \overline{S1s}$$

FIG. 4b

Divide by 3:

| CLK | S0 | S1m | S1s | S2m | S2s | Out |
|---|---|---|---|---|---|---|
| 0 | 0 | 0 | 0 | 1 | 0 | 0 |
| 1 | 0 | 1 | 0 | 1 | 1 | 0 |
| 0 | 1 | 1 | 1 | 1 | 1 | 1 |
| 1 | 1 | 1 | 1 | 1 | 1 | 1 |
| 0 | 0 | 1 | 1 | 1 | 1 | 1 |
| 1 | 0 | 0 | 1 | 1 | 1 | 0 |
| 0 | 0 | 0 | 0 | 1 | 1 | 0 |
| 1 | 0 | 1 | 0 | 1 | 1 | 0 |
| 0 | 1 | 1 | 1 | 1 | 1 | 1 |
| 1 | 1 | 1 | 1 | 1 | 1 | 1 |
| 0 | 0 | 1 | 1 | 1 | 1 | 1 |
| 1 | 0 | 0 | 1 | 1 | 1 | 0 |
| 0 | 0 | 0 | 0 | 1 | 1 | 0 |
| 1 | 0 | 1 | 0 | 1 | 1 | 0 |
| 0 | 1 | 1 | 1 | 1 | 1 | 1 |
| 1 | 1 | 1 | 1 | 1 | 1 | 1 |
| 0 | 0 | 1 | 1 | 1 | 1 | 1 |
| 1 | 0 | 0 | 1 | 1 | 1 | 0 |
| 0 | 0 | 0 | 0 | 1 | 1 | 0 |
| 1 | 0 | 1 | 0 | 1 | 1 | 0 |
| 0 | 1 | 1 | 1 | 1 | 1 | 1 |
| 1 | 1 | 1 | 1 | 1 | 1 | 1 |
| 0 | 0 | 1 | 1 | 1 | 1 | 1 |
| 1 | 0 | 0 | 1 | 1 | 1 | 0 |
| 0 | 0 | 0 | 0 | 1 | 1 | 0 |
| 1 | 0 | 1 | 0 | 1 | 1 | 0 |
| 0 | 1 | 1 | 1 | 1 | 1 | 1 |
| 1 | 1 | 1 | 1 | 1 | 1 | 1 |
| 0 | 0 | 1 | 1 | 1 | 1 | 1 |
| 1 | 0 | 0 | 1 | 1 | 1 | 0 |
| 0 | 0 | 0 | 0 | 1 | 1 | 0 |
| 1 | 0 | 1 | 0 | 1 | 1 | 0 |

$$Out_3 = S1m \cdot S1s$$

FIG. 4c

Divide by 3.5:

| CLK | S0 | S1m | S1s | S2m | S2s | Out |
|---|---|---|---|---|---|---|
| 0 | 0 | 0 | 0 | 1 | 0 | 1 |
| 1 | 0 | 0 | 0 | 1 | 0 | 1 |
| 0 | 1 | 0 | 0 | 1 | 0 | 1 |
| 1 | 1 | 1 | 0 | 1 | 0 | 1 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 0 | 1 | 1 |
| 1 | 0 | 0 | 0 | 0 | 1 | 1 |
| 0 | 1 | 0 | 0 | 0 | 1 | 1 |
| 1 | 1 | 1 | 0 | 0 | 1 | 0 |
| 0 | 1 | 1 | 1 | 0 | 0 | 0 |
| 1 | 1 | 0 | 1 | 0 | 0 | 0 |
| 0 | 0 | 0 | 0 | 1 | 0 | 1 |
| 1 | 0 | 0 | 0 | 1 | 0 | 1 |
| 0 | 1 | 0 | 0 | 1 | 0 | 1 |
| 1 | 1 | 1 | 0 | 1 | 0 | 1 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 0 | 1 | 1 |
| 1 | 0 | 0 | 0 | 0 | 1 | 1 |
| 0 | 1 | 0 | 0 | 0 | 1 | 1 |
| 1 | 1 | 1 | 0 | 0 | 1 | 0 |
| 0 | 1 | 1 | 1 | 0 | 0 | 0 |
| 1 | 1 | 0 | 1 | 0 | 0 | 0 |
| 0 | 0 | 0 | 0 | 1 | 0 | 1 |
| 1 | 0 | 0 | 0 | 1 | 0 | 1 |
| 0 | 1 | 0 | 0 | 1 | 0 | 1 |
| 1 | 1 | 1 | 0 | 1 | 0 | 1 |

$Out_{3.5} = S2s \cdot \overline{S1m} + \overline{S2s} \cdot \overline{S1s}$

FIG. 4d

Divide by 4:

| CLK | S0 | S1m | S1s | S2m | S2s | Out |
|---|---|---|---|---|---|---|
| 0 | 0 | 0 | 0 | 1 | 0 | 1 |
| 1 | 0 | 0 | 0 | 1 | 1 | 1 |
| 0 | 1 | 0 | 0 | 1 | 1 | 1 |
| 1 | 1 | 1 | 0 | 1 | 1 | 0 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 0 | 0 | 1 | 1 | 1 |
| 0 | 1 | 0 | 0 | 1 | 1 | 1 |
| 1 | 1 | 1 | 0 | 1 | 1 | 0 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 0 | 0 | 1 | 1 | 1 |
| 0 | 1 | 0 | 0 | 1 | 1 | 1 |
| 1 | 1 | 1 | 0 | 1 | 1 | 0 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |
| 0 | 0 | 0 | 0 | 1 | 1 | 1 |
| 1 | 0 | 0 | 0 | 1 | 1 | 1 |
| 0 | 1 | 0 | 0 | 1 | 1 | 1 |
| 1 | 1 | 1 | 0 | 1 | 1 | 0 |
| 0 | 1 | 1 | 1 | 1 | 1 | 0 |
| 1 | 1 | 1 | 1 | 1 | 1 | 0 |
| 0 | 0 | 1 | 1 | 1 | 1 | 0 |
| 1 | 0 | 0 | 1 | 1 | 1 | 1 |

$Out_4 = \overline{S1m}$

SYSTEM AND METHOD FOR CLOCK GENERATION WITH AN OUTPUT FRACTIONAL FREQUENCY DIVIDER

CROSS REFERENCE TO RELATED APPLICATIONS

The present application is related to and claims priority of U.S. provisional patent application ("Copending Provisional Application"), Ser. No. 62/030,486, entitled "System and Method for Clock Generation with an Output Fractional Frequency Divider," filed on Jul. 29, 2014. The disclosure of the Copending Provisional Application is hereby incorporated by reference in its entirety.

BACKGROUND OF THE INVENTION

1. Field of the Invention

The present invention relates to digital circuits. In particular, the present invention relates to clock signal generation circuits.

2. Discussion of the Related Art

In a typical prior art clock signal generation circuit, the output circuit includes a frequency divider that has integer modulus steps (i.e., the output clock signal is derived from dividing the frequency of a source clock signal, such as an internal clock signal, by an integer). In other words, the output signal has a frequency which is an integer submultiple of the frequency of the source clock signal. In this context, an integer submultiple frequency refers to the frequency obtained by dividing a source frequency by an integer.

FIG. 1 is a block diagram of conventional clock generation circuit 100. As shown in FIG. 1, clock generation circuit 100 includes phase-locked loop (PLL) 101 and output frequency divider 102. PLL 1010 typically includes a voltage-controlled oscillator (VCO) that operates within a frequency range between $f_{LO}$ and $f_{HI}$. The performance of PLL 101 is often limited by its VCO. This is because a VCO that operates at a high absolute operating frequency or that operates over a wide frequency range, generally has a lower performance and a greater complexity than VCOs that operate at lower frequencies or over a narrower range. In a clock signal generation circuit, such as clock generation circuit 100 of FIG. 1, its highest output frequency $f_{max}$ is related to its VCO's highest operating frequency $f_{HI}$ by the equation:

$$f_{HI} = f_{max} \times N_{min}$$

where $N_{min}$ is the least divider. Additionally, if clock signal generator 100 is required to provide an output frequency that is to be continuously programmable to a lower frequency without any significant coverage gap, the VCO frequency range must be wide enough to cover the ratio from $N_{min}$ to the next lowest N value (i.e., $N_{min+1}$), i.e., $$\frac{f_{HI}}{f_{LO}} \geq \frac{N_{min+1}}{N_{min}}$$

SUMMARY

According to one embodiment of the present invention, a system and a method generate clock signals using an output divider with modulus steps of half-integers (i.e., the output circuit includes a divider which divides by one or more of 2, 2.5, 3, 3.5, 4 ... ). The clock signal generation circuit includes: (a) a phase-locked loop including a voltage-controlled oscillator that receives an input clock signal and provides an output signal phase-locked to the input clock signal; and (b) a frequency divider circuit providing a plurality of output signals of various frequencies, wherein the various frequencies include both an integer submultiple and a half-integer submultiple of the frequency of the output signal of the phase-locked loop. The frequency divider circuit may include a first divider circuit and a second divider circuit connected in series, in which the first divider circuit divides the frequency of the output signal of the phase-locked loop by an integer.

The present invention is better understood upon consideration of the detailed description below in conjunction with the accompanying drawings.

BRIEF DESCRIPTION OF THE DRAWINGS

FIGS. 3(a)-3(e) show schematic circuits 310, 320, 330, 340 and 350 within divider 201 of FIG. 2 for implementing a divide-by-2 circuit, a divide-by-2.5 circuit, a divide-by-3 circuit, a divide-by-3.5 circuit and a divide-by-4 circuit, respectively, in accordance with one embodiment of the present invention.

FIGS. 4(a)-4(e) show the logic state transition tables for the output signals of the divide-by-2 circuit 310, divide-by-2.5 circuit 320, divide-by-3 circuit 330, divide-by-3.5 circuit 340 and divide-by-4 circuit 350 of FIGS. 3(a)-3(e).

To facilitate cross-referencing among the figures, like elements are provided like reference numerals.

DETAILED DESCRIPTION OF THE PREFERRED EMBODIMENTS

The present invention provides a clock generation circuit capable of generating an output clock signal that is a fractional submultiple of a source frequency. (In this detailed description, the term "fractional submultiple frequency" refers the frequency obtained by dividing a source frequency by an improper fraction). One example of a clock generation circuit of the present invention includes a clock signal divider circuit that allows frequency division in half-integer steps (e.g., a clock signal divider that allows frequency division by 1, 1.5, 2, 2.5, 3, 3.5, ... ).

Using half-integer steps is advantageous over using full-integer steps. For example, if the required maximum operating frequency $f_{max}$ of an output clock signal is 2.5 GHz, and the optimum maximum VCO frequency for a given process is 5 GHz, the least divider for a clock signal generation circuit manufactured using that process would be $N_{min}=2$. In a prior art clock signal generation circuit, the next divider value would be $N_{min+1}=3$, so that the ratio $$\frac{f_{HI}}{f_{LO}}$$

is at least 1.5, or $f_{HI}=5$ GHz, and $f_{LO}$ may be up to 3.33 GHz. However, a clock signal generation circuit with a divider that includes half-integer steps, according to the present invention, the next divider value would be $N_{min+1}$=2.5. With $N_{min+1}$=2.5, given the relation $$\frac{f_{HI}}{f_{LO}} \geq 1.25,$$

and the PLL may operate with an $f_{LO}$ of up to 4 GHz. This reduction in VCO operating range provides a distinct performance advantage to the clock signal generator circuit with a half-integer step divider.

Figure 1:
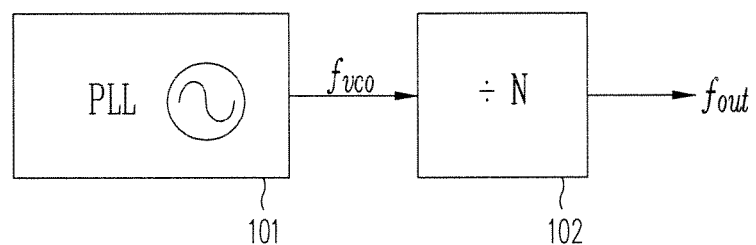
FIG. 1 is a block diagram of conventional clock generation circuit 100.
Figure 2:
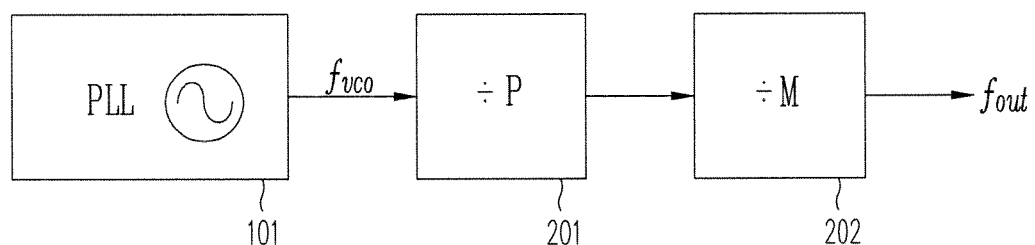
FIG. 2 shows clock signal generator circuit 200, according to one embodiment of the present invention.
Figure 3A:
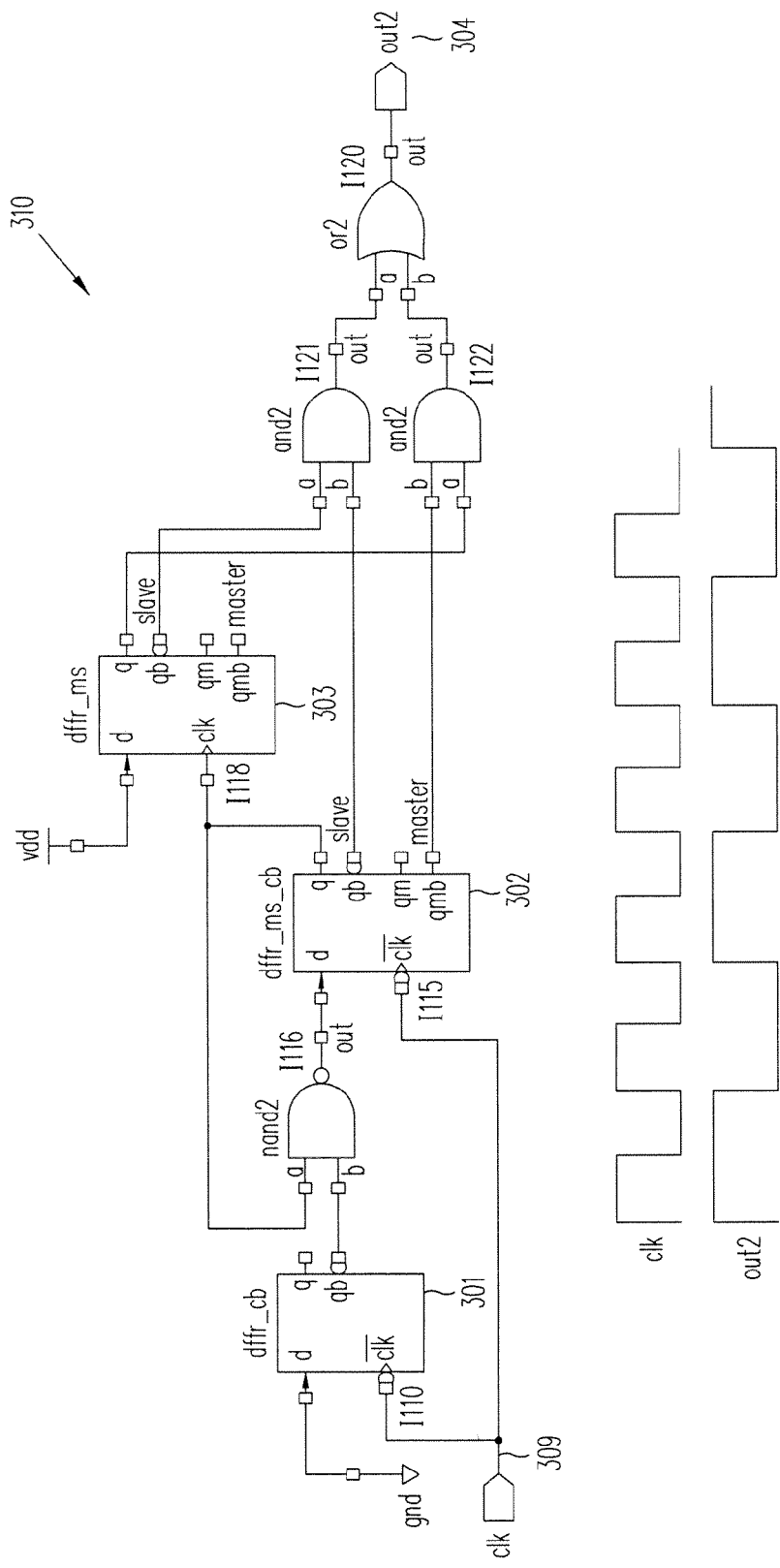
Figure 3D:
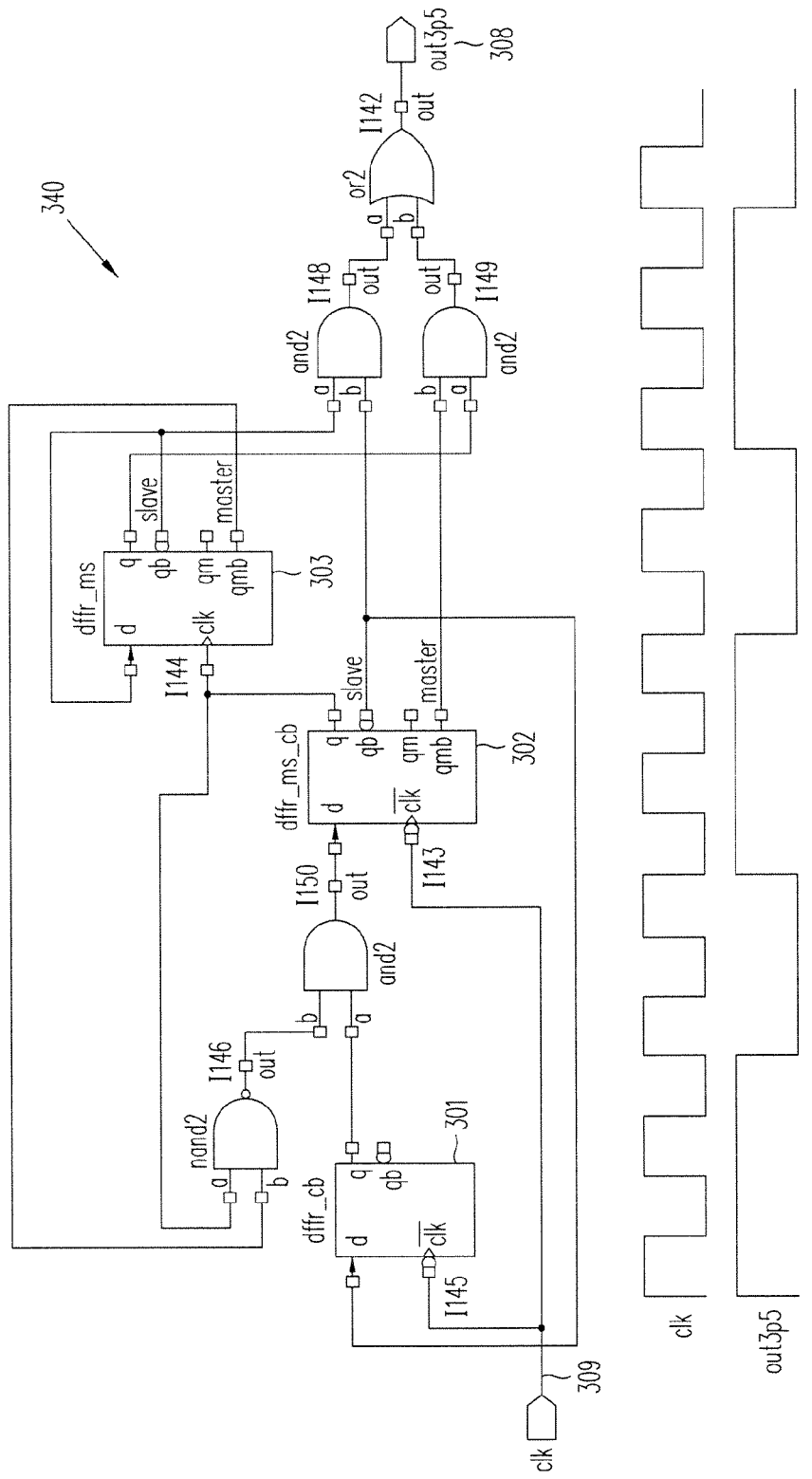

FIG. 2 shows clock signal generator circuit 200, according to one embodiment of the present invention. As shown in FIG. 2, unlike single frequency divider 102 of FIG. 1, clock signal generator circuit 200 includes frequency divider 201 ("divider P") and frequency divider 202 ("divider M"). Divider P provides divider values 2, 2.5, 3, 3.5, and 4, while divider M provides divider values 1, 2, 4, 8, 12, 16, 24, 32, . . . , 512. Under this arrangement, a continuous range of output frequencies from 2.5 GHz to 1.95 MHz is achievable for a VCO with an operating frequency range of 4 GHz to 5 GHz. Divider M may be implemented in any manner, including the same manner as frequency divider 102 of FIG. 1, as the output divider values are integers. Divider P may be implemented using a three flip-flop state machine, although other implementations also may be suitable.

FIGS. 3(a)-3(e) are schematic circuits 310, 320, 330, 340 and 350 within divider P (i.e., divider 201) for implementing a divide-by-2 circuit, a divide-by-2.5 circuit, a divide-by-3 circuit, a divide-by-3.5 circuit and a divide-by-4 circuit, respectively, in accordance with one embodiment of the present invention. As shown in each of circuits 310-350, flip-flops 301-303 are each a master-slave flip-flop, providing both positive and inverted output signals from their slave latches. In addition, for flip-flops 302 and 303, both positive and inverted output signals are also provided from their respective master latches. The output signals from the slave latches of flip-flops 301-303, together with the output signals from flip-flops 302 and 303 provide 5 binary state variables to implement a state machine with 32 theoretically possible states, of which 16 are actually used in the circuit implementations shown in FIGS. 3(a)-3(e).

As seen from FIGS. 3(a)-3(e), circuits 310, 320, 330, 340 and 350 provide divider signals 304-308, each of which is generated by a combinational logic circuit which derives its input signals from output signals of flip-flop 301-303. FIGS. 4(a)-4(e) show the logic state transition tables for the output signals of divide-by-2 circuit 310, divide-by-2.5 circuit 320, divide-by-3 circuit 330, divide-by-3.5 circuit 340 and divide-by-4 circuit 350 of FIGS. 3(a)-3(e). In these logic state transition tables, state variable CLK represents the logic state of input clock signal 309, state variable S0 represents the logic state of the output signal of the slave latch in flip-flop 301, state variables S1m and S1s represent the logic states of the output signals of the master latch and the slave latch of flip-flop 302, and state variables S2m and S2s represent the logic states of the output signals of the master latch and the slave latch of flip-flop 303, respectively.

The above detailed description is provided to illustrate the specific embodiments of the present invention and is not intended to be limiting. Many variations and modifications within the scope of the present invention are possible. The present invention is set forth in the accompanying claims.

I claim:

1. A clock signal generation circuit, comprising:
 a phase-locked loop including a voltage-controlled oscillator, the phase-locked loop receiving an input clock signal and providing an output signal that is phase-locked to the input clock signal; and
 a frequency divider circuit receiving the output signal of the phase-locked loop, wherein the frequency divider circuit (i) generates a plurality of signals of various frequencies by dividing the frequency of the output signal of the phase-locked loop by selected numerical constants, and (ii) generates an output signal of the clock signal generation circuit from one of the signals of various frequencies, wherein the various frequencies include both an integer submultiple and a fractional submultiple of the frequency of the output signal of the phase-locked loop, and wherein the fractional submultiple is not an integer submultiple.

2. The clock signal generation circuit of claim 1, wherein the frequency divider circuit comprises a first divider circuit and a second divider circuit connected in series, wherein the first divider circuit divides the frequency of the output signal of the phase-locked loop by a multiple of ½ that is greater than 1.

3. A method for generating a divided clock signal with a frequency that is a fractional submultiple of the frequency of an input clock signal, comprising:
 using a phase-locked loop that includes a voltage-controlled oscillator and which receives the input clock signal and provides as output a reference clock signal, the reference clock signal being phase-locked to the input clock signal; and
 in a frequency divider circuit that receives the reference clock signal as input, (i) generating a plurality of signals of various frequencies generated in the frequency divider circuit by dividing the reference clock signal by selected numerical constants, and (ii) generating the divided clock signal from one of the signals of various frequencies, wherein the various frequencies include both an integer submultiple and a fractional submultiple of the frequency of the reference clock signal, and wherein the fractional submultiple is not an integer submultiple.

4. The method of claim 3, wherein the frequency divider circuit comprises a first divider circuit and a second divider circuit connected in series, wherein the first divider circuit divides the frequency of the reference signal by a multiple of ½ that is greater than 1.

5. The clock signal generation circuit of claim 1, wherein the signals of various frequencies are each generated using a state machine.

6. The method of claim 3, wherein the signals of various frequencies are each generated using a state machine.

* * * * *